(12) United States Patent
Takeno et al.

(10) Patent No.: US 9,558,801 B2
(45) Date of Patent: Jan. 31, 2017

(54) DATA HOLDING CIRCUIT INCLUDING LATCH CIRCUIT AND STORING CIRCUIT HAVING MTJ ELEMENTS AND DATA RECOVERY METHOD

(71) Applicant: SOCIONEXT INC., Yokohama-shi, Kanagawa (JP)

(72) Inventors: Hirotaka Takeno, Tachikawa (JP); Akio Yamamoto, Kasugai (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/755,935

(22) Filed: Jun. 30, 2015

(65) Prior Publication Data

US 2016/0005450 A1  Jan. 7, 2016

(30) Foreign Application Priority Data

Jul. 7, 2014  (JP) ................................. 2014-139960

(51) Int. Cl.
| | |
|---|---|
| G11C 11/00 | (2006.01) |
| G11C 11/16 | (2006.01) |
| G11C 14/00 | (2006.01) |
| H03K 3/3562 | (2006.01) |
| G11C 13/00 | (2006.01) |
| H03K 19/18 | (2006.01) |

(52) U.S. Cl.
CPC ......... *G11C 11/1675* (2013.01); *G11C 14/009* (2013.01); *G11C 14/0081* (2013.01); *H03K 3/3562* (2013.01); *G11C 13/0007* (2013.01); *G11C 13/0069* (2013.01); *H03K 19/18* (2013.01)

(58) Field of Classification Search
CPC ........... G11C 11/16; G11C 11/15; H01L 43/08
USPC ............................. 365/158, 154, 156, 189.05
See application file for complete search history.

(56) References Cited

U.S. PATENT DOCUMENTS

| | | | |
|---|---|---|---|
| 6,337,582 B1 * | 1/2002 | Yoshioka | G11C 7/1078 326/113 |
| 7,006,371 B2 | 2/2006 | Matsuoka | |
| 7,023,255 B1 * | 4/2006 | Mercer | H03K 3/356156 327/199 |
| 2004/0150448 A1 * | 8/2004 | Jones, Jr. | H03K 3/0375 327/199 |
| 2009/0262568 A1 | 10/2009 | Ono et al. | |

(Continued)

FOREIGN PATENT DOCUMENTS

| | | |
|---|---|---|
| JP | 2004-234707 A | 8/2004 |
| JP | 2009-26382 A | 2/2009 |
| JP | 2012-89187 A | 5/2012 |

*Primary Examiner* — Connie Yoha
(74) *Attorney, Agent, or Firm* — Arent Fox LLP

(57) ABSTRACT

A data holding circuit includes: a latch circuit having a first terminal and a second terminal, a logical value held at the first terminal being changed according to a value to be held by the data holding circuit, and the second terminal holding an inverted logical value of the logical value held at the first terminal; and a storing circuit which stores the logical values held at the first terminal and the second terminal in response to a write signal, and sets the logical values held at the first terminal and the second terminal to the stored logical values in response to a read signal, wherein the storing circuit includes two Magnetic Tunnel Junction elements which are connected in series between the first terminal and the second terminal and in reverse directions to each other.

7 Claims, 7 Drawing Sheets

(56) References Cited

U.S. PATENT DOCUMENTS

2013/0286721 A1* 10/2013 Jung .................. G11C 11/1673
365/158

* cited by examiner

CURRENT WHEN "LOW" IS WRITTEN

CURRENT WHEN "HIGH" IS WRITTEN

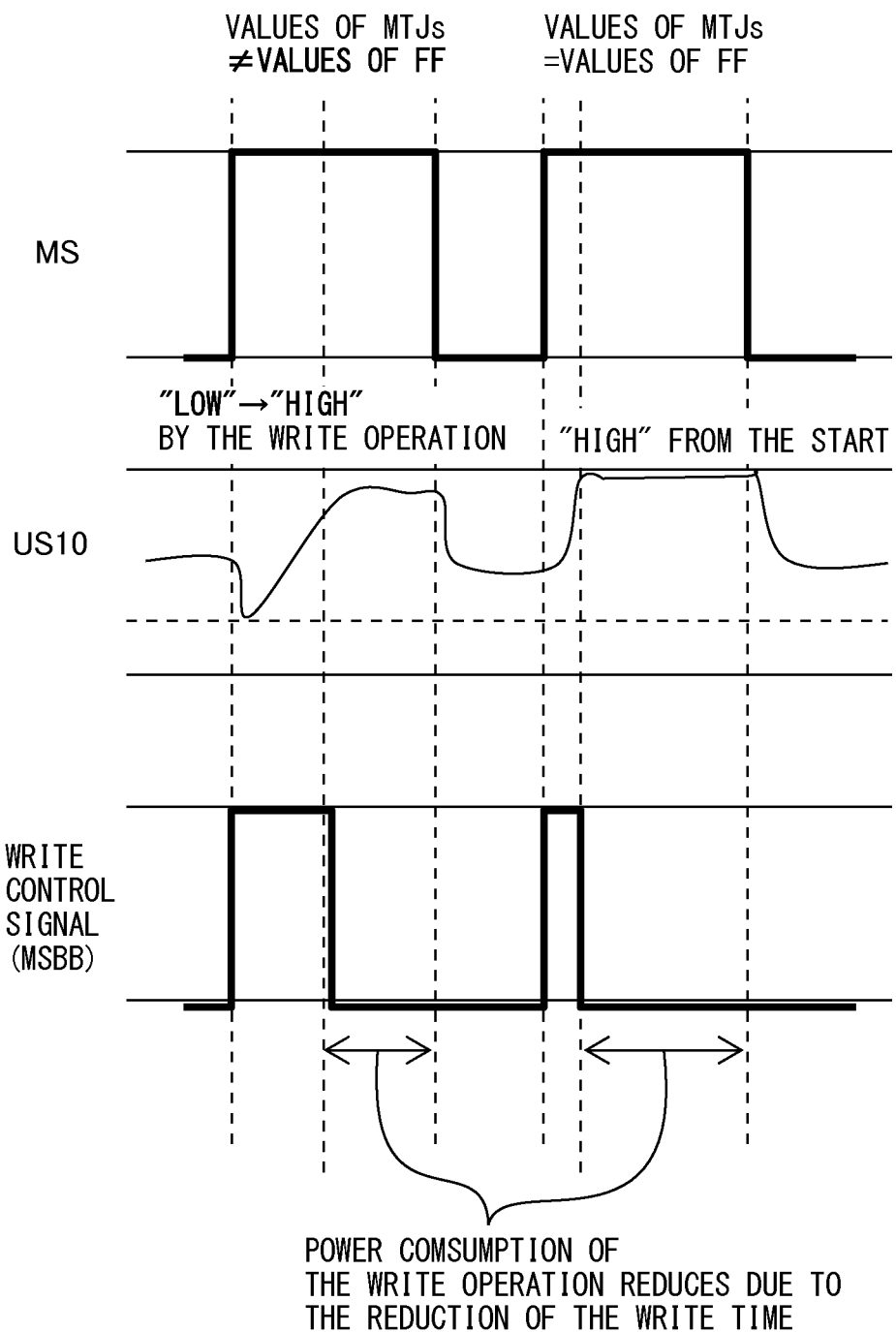

DATA HOLDING CIRCUIT INCLUDING LATCH CIRCUIT AND STORING CIRCUIT HAVING MTJ ELEMENTS AND DATA RECOVERY METHOD

CROSS-REFERENCE TO RELATED APPLICATION

This application is based upon and claims the benefit of priority of the prior Japanese Patent Application No. 2014-139960, filed on Jul. 7, 2014, the entire contents of which are incorporated herein by reference.

FIELD

The technique disclosed herein relates to a data holding circuit and a data recovery method.

BACKGROUND

Semiconductor devices are desired to reduce power consumption. Further, semiconductor devices used in a system are desired to reduce power consumption by intentionally stopping power supply to constitutional elements, except for basic constitutional elements which need to operate in order to maintain the operation of the system. In order to realize the above-mentioned stop of power supply in the semiconductor device, when power is supplied again, elements including data holding circuits, which carry out data holding operations in normal circuitry operations, may be required to continue processing operations by using data held in the data holding circuits before the stop of the power supply.

In order to realize the above operations, data which is necessary to set the data holding circuits when the power is supplied again is temporarily stored in memory cells before the stop of the power supply, and the data holding circuits are set according to the stored data after the power is supplied again. These data holding circuits, which are set according to the stored data, are a part of constitutional elements to which the power supply is stopped. Thus, data set according to the stored data may be carried out to a part of many data holding circuits.

However, in the above constitution, the semiconductor device includes memory cells in addition to normal operational circuits having the constitutional elements. If the power supply to the memory cells is also stopped, the memory cells are required to be non-volatile. Further, when the power supply is stopped, an operation obtaining data in the data holding circuits and an operation storing the obtained data to the memory cells are sequentially carried out. Further, when the power is supplied again, an operation reading the stored data from the memory cells and an operation setting the read data to the data holding circuits are sequentially carried out.

Various memories have been known as non-volatile memory devices which hold data of when power supply to the devices is stopped, and integrated circuits in which MTJ (Magnetic Tunnel Junction) elements are formed have been known. In particular, non-volatile memories in which memory cells including MTJ elements are arranged at cross-points of a plurality of word lines and a plurality of bit lines have been proposed. However, these non-volatile memories including MTJ elements are memory devices which are used in place of NAND-type flash memories, etc.

RELATED DOCUMENTS

[Patent Document 1] Japanese Laid Open Patent Publication No. 2009-26382

[Patent Document 2] Japanese Laid Open Patent Publication No. 2004-234707

[Patent Document 3] Japanese Laid Open Patent Publication No. 2012-89187

SUMMARY

According to a first aspect of embodiments, a data holding circuit including: a latch circuit having a first terminal and a second terminal, a logical value held at the first terminal being changed according to a value to be held by the data holding circuit, and the second terminal holding an inverted logical value of the logical value held at the first terminal; and a storing circuit which stores the logical values held at the first terminal and the second terminal in response to a write signal, and sets the logical values held at the first terminal and the second terminal to the stored logical values in response to a read signal, wherein the storing circuit includes two Magnetic Tunnel Junction elements which are connected in series between the first terminal and the second terminal and in reverse directions to each other.

The object and advantages of the embodiments will be realized and attained by means of the elements and combination particularly indicated in the claims.

It is to be understood that both the foregoing general description and the following detailed description are exemplary and explanatory and are not restrictive of the invention.

BRIEF DESCRIPTION OF THE DRAWINGS

FIG. 9 is a time chart illustrating changes of a write signal MS, a potential of a node US10, and a write control signal MSBB.

DESCRIPTION OF EMBODIMENTS

Before explaining data holding circuits of the embodiments, a general data holding circuit will be explained.

Figure 1:
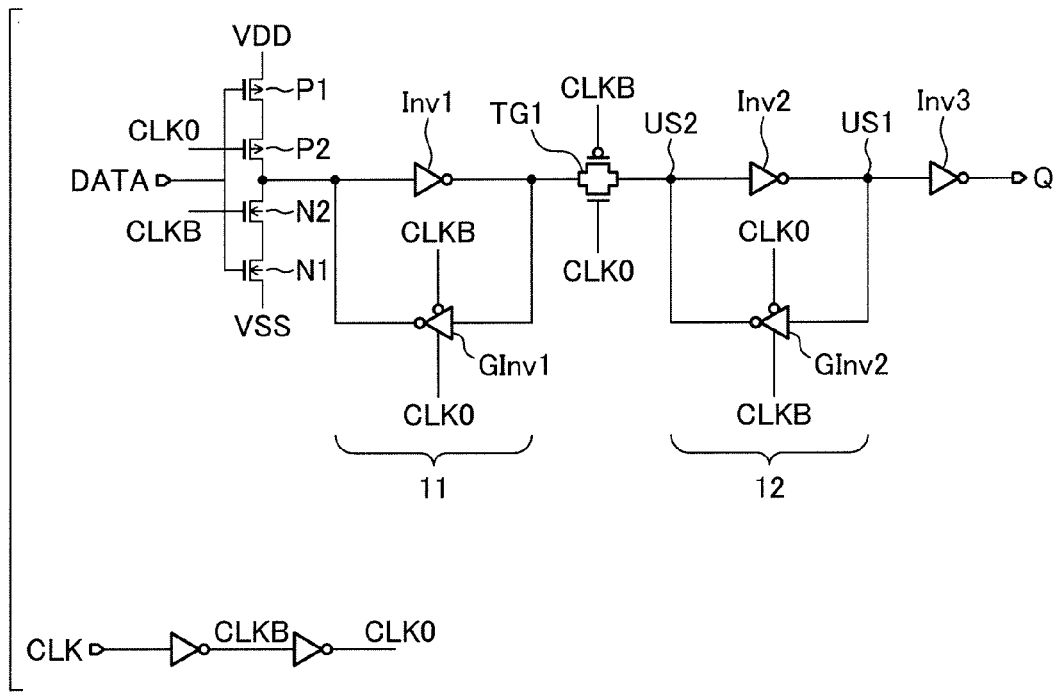
FIG. 1 is a circuit diagram illustrating an example of a clock-synchronous-type flip-flop (FF) which is widely used as a data holding circuit.

FIG. 1 is a circuit diagram illustrating an example of a clock-synchronous-type flip-flop (FF) which is widely used as a data holding circuit.

As illustrated at a lower portion in FIG. 1, inverters, which are connected in series to form two stages, generate a positive-phase clock CLK0 and a negative-phase clock CLKB from a clock CLK. The clock-synchronous-type FF operates according to CLK0 and CLKB.

The clock-synchronous-type flip-flop (FF) includes: an input gate; a flip-flop portion; and an output inverter.

The input gate includes two P-channel transistors P1 and P2, and two N-channel transistors N1 and N2, which are connected in series between power supply lines VDD and VSS. Input data DATA is applied to gates of P1 and N1, CLK0 is applied to a gate of P2, and CLKB is applied to a gate of N2. The input gate inverts the input data DATA and outputs the inverted data to the flip-flop portion in a former half duration of a cycle of the clock CLK, in which CLK is at a low level, and the input gate maintains the output to be high-impedance in a later half duration of a cycle of CLK, in which CLK is at a high level.

The flip-flop portion includes a first stage 11; a transfer gate TG1; and a second stage 12. The first stage and the second stage are formed by latch circuits. The first stage includes an inverter Inv1 and a clock-synchronous-type inverter GInv1. Inputs and outputs of Inv1 and GInv1 are connected to each other. The output of the input gate is connected to the input of the first stage (namely, the input of Inv1 and the output of GInv1), and the output of the first stage (namely, the output of Inv1 and the input of GInv1) is connected to TG1. The second stage includes an inverter Inv2 and a clock-synchronous-type inverter GInv2. Inputs and outputs of Inv2 and GInv2 are connected to each other. An output of TG1 is connected to an input node US2 of the second stage (namely, the input of Inv2 and the output of GInv2), and an output node US1 of the second stage (namely, the output of Inv2 and the input of GInv2) is connected to the output inverter Inv3. An output of Inv3 becomes an output Q of the FF.

The output of GInv1 becomes high-impedance in the former half duration of the clock, and the output of GInv1 becomes active in the later half duration of the clock. The output of GInv2 becomes active in the former half duration of the clock, and the output of GInv2 becomes high-impedance in the later half duration of the clock. In other words, operational phases of GInv1 and GInv2 are reverse to each other. The output of TG1 becomes a high-impedance in the former half duration of the clock and TG1 becomes a through-state in the later half duration of the clock.

Since the circuitry constitution and operations of the FF illustrated in FIG. 1 have been well known, further explanations are omitted.

A clock-synchronous-type operational circuit includes numerous FFs illustrated in FIG. 1 since the circuit totally operate in synchronous with the clock and total operations of the circuit are correctly controlled although delays respectively occur in respective portions of the circuit. When the clock CLK is stopped to be supplied to the FF illustrated in FIG. 1, the FF continues to hold the data of when CLK is stopped.

The FF illustrated in FIG. 1 continues to hold the data of when the clock is stopped during a power is supplied to the FF. However, a data holding function of the FF is not available for the stop of power supply. Therefore, when power supply is stopped, nodes in the circuit become to uncertain states, and the data of before the stop of power supply is not held. Accordingly, in order to recover the state of before the stop of power supply when power is supplied again, additional memory cells, etc., for storing data are provided outside the data holding circuit. The data held in the data holding circuit is stored in the additional memory cells before power supply is stopped, and the data holding circuit is set to the state of before the stop of power supply according to the data read from the additional memory cells.

Figure 2:
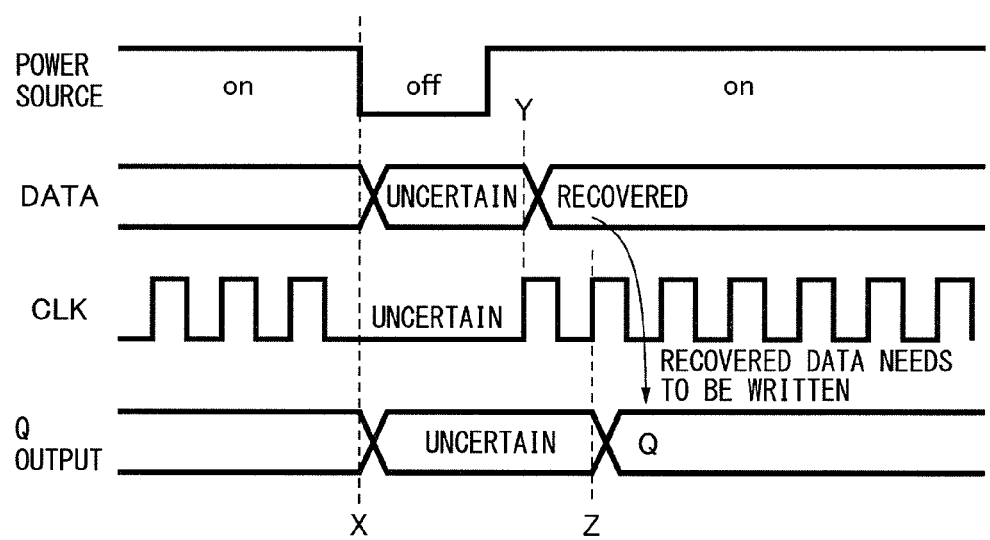
FIG. 2 is a time chart illustrating operations of the FF of FIG. 1 when a power supply is stopped and the power is then supplied again.

FIG. 2 is a time chart illustrating operations of the FF of FIG. 1 when a power supply is stopped and the power is then supplied again.

When POWER SUPPLY is changed from on to off (the supply is stopped) at a time designated by X, Q OUTPUT is uncertain. FIG. 2 illustrates that input data DATA also becomes uncertain and no CLK is input during the power supply is stopped. As described later, in order to recover previous data, Q OUTPUT (or input data DATA) is stored in memory cells before the power supply is stopped.

When POWER SUPPLY is changed from off to on (the power is supplied again) and CLK is started to be input at a time designated by Y, uncertain input data DATA at that time becomes Q OUTPUT. It is different according to the state of the circuit what data is output, namely, Q OUTPUT is uncertain. Therefore, in order to recover the data holding circuit to output the previous data of before the power supply is stopped, the input data DATA or Q OUTPUT, which is stored in the memory cells, is input as the input data DATA. Thus, the previous data is recovered in synchronous with the next rising edge of CLK.

As described above, in order to recover the previous data, Q OUTPUT is read from each FF and stored in the memory cell before the power supply is stopped, and the stored data read from the memory cell is input to the FF when the power is supplied again. In other words, data transfer from the FF to the memory cell and data transfer from the memory cell to the FF are carried out. These transfers are carried out for each FF. Therefore, when a plurality of FFs of which data is recovered, a plurality of data transfers are respectively carried out before the power supply is stopped and after the power is supplied again. Accordingly, when a number of FFs of which data is recovered is large, a time to be required to carry out the data transfers before the power supply is stopped and after the power is supplied again becomes large.

A non-volatile memory using MTJ (Magnetic Tunnel Junction) elements has been known. The MTJ element is a variable resistance element which has a resistance characteristic different for current directions and of which resistance changes when a flowing direction of a write current is changed. When data is written, the write current is flew through the MTJ element by changing a direction of the write current according to a value of the write data, and a value of the resistance of the MTJ element is changed according to the direction of the write current. When the written data is read, a voltage difference or a current difference according to the difference of the resistance value is detected when a read current flows. A value of the read current is smaller than that of the write current so that the read current does not change a state of the MTJ element.

Various types of non-volatile memories including MTJ elements arranged at cross-points of a plurality of word lines and a plurality of bit lines have been proposed as semiconductor devices using MTJ elements. However, none of these devices are intended to replace NAND-type flash memories. Therefore, when the non-volatile memories including MTJ elements are used, they are used as memory cells for storing Q OUTPUTs obtained from respective FFs before the power supply is stopped. As describe above, since the data transfers before the power supply is stopped and after the power is supplied again are carried out in this constitution, there is a problem that processing time for carrying out the data transfers is long.

In each of data holding circuits of embodiments described in the following, a storing circuit including two MTJ elements is attached to a data holding circuit, and the data holding circuit recovers a previous data of before a power supply is stopped. When there is a plurality of data holding circuits each of which previous data is recovered, the plurality of data holding circuits carry out the storing and setting operations of data in parallel.

Figure 3:
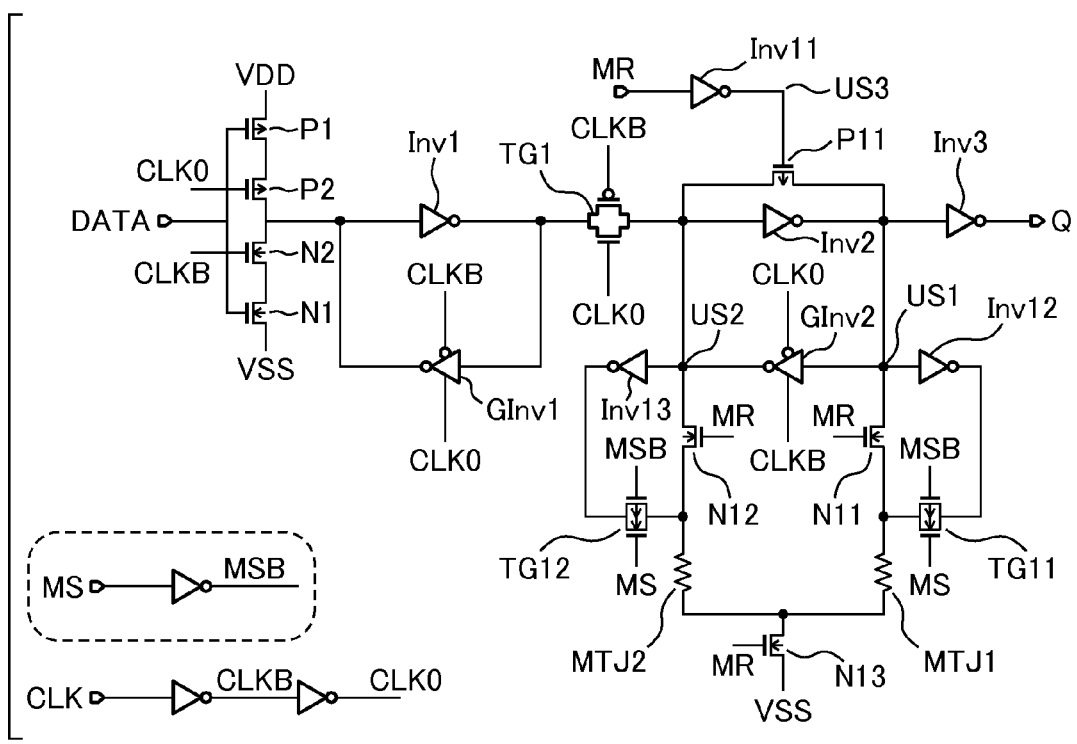
FIG. 3 is a circuit diagram illustrating a data holding circuit of a first embodiment.

FIG. 3 is a circuit diagram illustrating a data holding circuit of a first embodiment. The data holding circuit of the first embodiment is similar to the clock-synchronous-type flip-flop (FF) illustrated in FIG. 1.

As illustrated in FIG. 3, inverters, which are connected in series to form two stages, generate a positive-phase clock CLK0 and a negative-phase clock CLKB from a clock CLK. Further, one inverter generates an inverted write signal MSB from a write signal MS. The data holding circuit of the first embodiment operates according to CLK0, CLKB, MS, MSB and a read signal MR.

The data holding circuit of the first embodiment includes: an input gate; a flip-flop portion; and an output inverter Inv3. The flip-flop portion includes; a first stage; a transfer gate TG; and a second stage. The input gate, the first stage and the transfer gate of the flip-flop portion, and the output inverter Inv3 are same as those of FIG. 1. Therefore, the data holding circuit of the first embodiment is same as those of the FF of FIG. 1, except that the second stage of the first embodiment differs from that of the FF of FIG. 1. In the following, only different portions will be described.

The second stage of the flip-flop portion of the data holding circuit of the first embodiment has a constitution in which a storing circuit is added to a latch circuit of the second stage of the flip-flop portion of FIG. 1.

The storing circuit includes: two MTJ elements MTJ1 and MTJ2; a write circuit; a read circuit. The write circuit sets MTJ1 and MTJ2 to be states corresponding to logical values of nodes US1 and US2 of the latch circuit of the second stage in response to signals MS and MSB before a power supply is stopped. The read circuit sets the nodes US1 and US2 of the latch circuit of the second stage to have logical values corresponding to the states of MTJ1 and MTJ2 when the power is supplied again. The node US1 of the second stage is a node to which an output of Inv2 and an input of GInv2 are connected, and the node US1 is connected to Inv3. The node US2 of the second stage is a node to which an input of Inv2 and an output of GInv2 are connected, and the node US2 is connected to TG1.

The write circuit includes: an inverter Inv12 and a transfer gate TG11 connected in series between US1 and MTJ1; and an inverter Inv13 and a transfer gate TG12 connected in series between US2 and MTJ2.

The read circuit includes: a P-channel transistor P11 connected between US1 and US2; an inverter Inv11 inverting MR and applying the inverted MR to a gate of P11; an N-channel transistor N11 connected between US1 and MTJ1; an N-channel transistor N12 connected between US2 and MTJ2; and an N-channel transistor N13 connected between a connection node of MTJ1 and MTJ2 and a low potential power supply VSS.

Figure 4A:
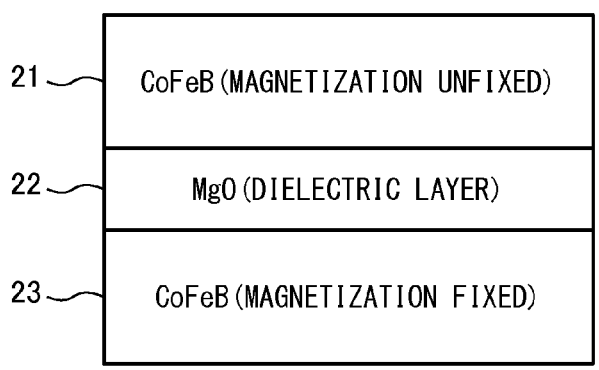
FIG. 4A is a diagram illustrating a constitution of an MTJ element.
Figure 4B:
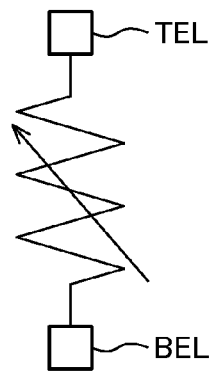
FIG. 4B is a diagram illustrating a symbol representing the MTJ element.

FIG. 4A is a diagram illustrating a constitution of the MTJ element, and FIG. 4B is a diagram illustrating a symbol representing the MTJ element.

As illustrated in FIG. 4A, the MTJ element includes: an MgO dielectric layer 22; a magnetization direction unfixed layer 21 of CoFeB arranged at one side of the MgO dielectric layer 22; and a magnetization direction fixed layer 23 of CoFeB arranged at the other side of the MgO dielectric layer 22. The MTJ element changes its resistance according current directions. In other words, a resistance of the MTJ element of when the write current flows from the magnetization direction unfixed layer 21 to the magnetization direction fixed layer 23 is different from that of when the write current flows in an opposite direction with respect to the above direction. The MTJ element stores a logical value (data) by using this characteristic that the resistance changes according to a direction of the write current. When the written data is read, a voltage difference or a current difference according to the difference of the resistance value is detected when a read current flows. A value of the read current is smaller than that of the write current so that the read current does not change the state of the MTJ element. In the first embodiment, the resistance becomes comparatively large when the write current flows in a direction (reverse direction) from the magnetization direction unfixed layer (TEL) 21 to the magnetization direction fixed layer (BEL) 23 and becomes comparatively small when the write current flows in a direction (forward direction) from the magnetization direction fixed layer (BEL) 23 to the magnetization direction unfixed layer (TEL) 21.

The MTJ element is represented by the symbol illustrated in FIG. 4B.

In FIG. 3, MTJ1 and MTJ2 are arranged so that magnetization layers of the same type of MTJ1 and MTJ2 face to the connection node. In other words, magnetization layers of the same type of MTJ1 and MTJ2 face to each other via the connection node. In the first embodiment, BEL of MTJ1 is connected to N11 and TEL of MTJ1 is connected to N13. BEL of MTJ2 is connected to N12 and TEL of MTJ2 is connected to N13. Accordingly, a path from N11 to N13 through MTJ1 is a forward direction, and a path from N12 to N13 through MTJ2 is a forward direction.

Figure 5:
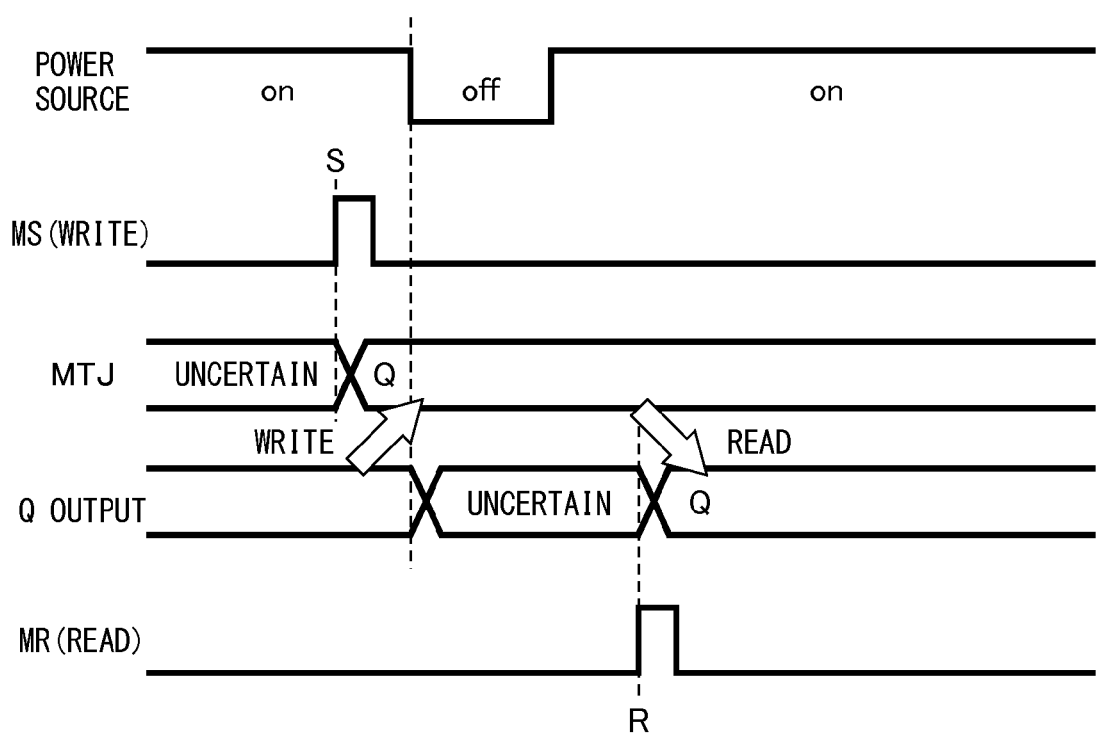
FIG. 5 is a time chart illustrating operations in the data holding circuit of the first embodiment when the power supply is stopped and the power is then supplied again.

FIG. 5 is a time chart illustrating operations in the data holding circuit of the first embodiment when the power supply is stopped and the power is then supplied again.

Before the POWER SUPPLY is changed from on to off (the power supply is stopped), the write signal MS rises at a time designated by S. In response to the rise of MS, MTJ1 and MTJ2 becomes to states corresponding to logical values of nodes US1 and US2. This operation is referred to as a write operation. After the write operation is completed, MS falls and the power supply is stopped.

When the power supply is stopped, Q OUTPUT becomes uncertain. However, since MTJ1 and MTJ2 hold their states after the power supply is stopped, the states which are set in the write operation are maintained.

When POWER SUPPLY is changed to on (the power is supplied again) after it is changed from on to off, Q OUTPUT is maintained at the uncertain state. In this state, the read signal MR rises at a time designated by R. In response to the rise of MR, US3 becomes low. Then, MR falls, logical values of the nodes US1 and US2 change to values corresponding to the logical values which were set at MTJ1 and MTJ2, and Q OUTPUT changes to the logical value of before the power supply is stopped. This operation is referred to as a read operation. Thus, the data holding circuit is recovered to the state of before the power supply is stopped, and the data holding circuit becomes to a normal state operating according to the clock CLK.

Figure 6A:
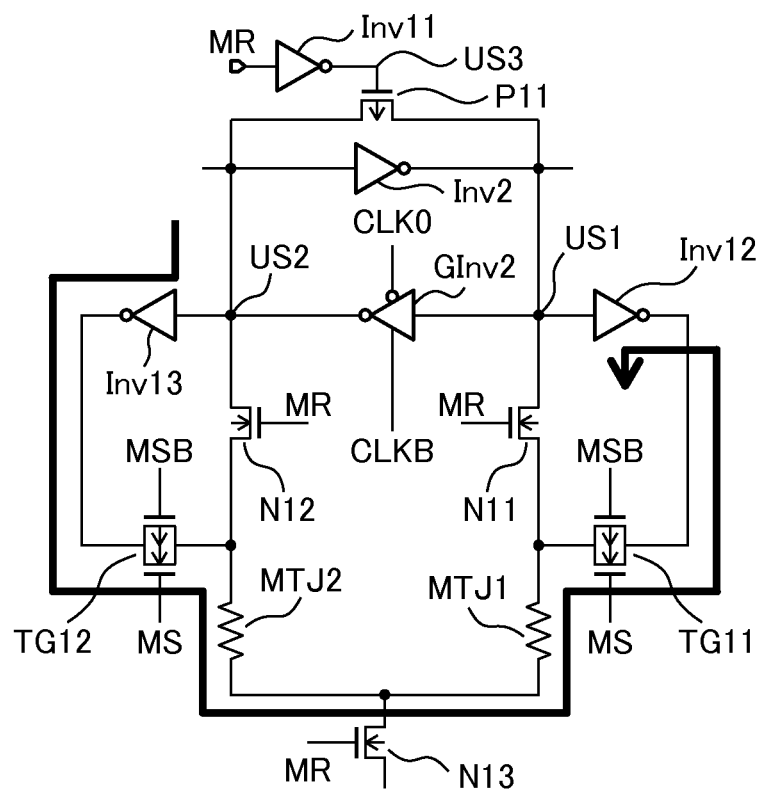
FIGS. 6A and 6B are diagrams illustrating the write operation and the read operation in the latch circuit at the second stage of the data holding circuit of the first embodiment.
Figure 6B:
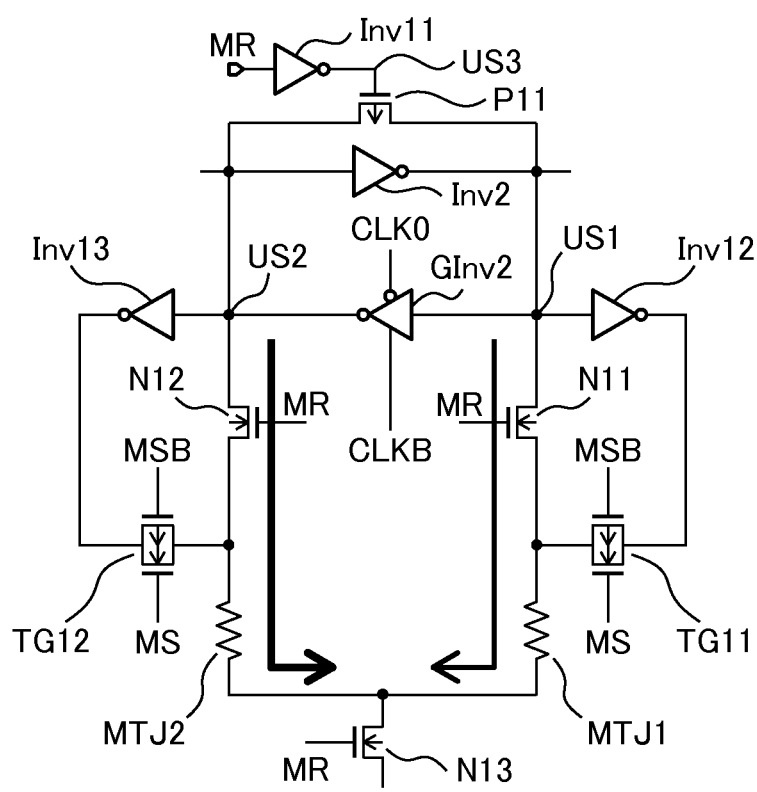

FIGS. 6A and 6B are diagrams illustrating the write operation and the read operation in the latch circuit at the second stage of the data holding circuit of the first embodiment. FIG. 6A illustrates a current path in the write operation when Q OUTPUT is low, node US1 is high, and node US2 is low in the latch circuit of the second stage. FIG. 6B illustrates a current path in the read operation when MTJ1 has a comparatively large resistance and MTJ2 has a comparatively small resistance.

In the write operation, the write signal MS is set to high, and the read signal MR is maintained at low. At this condition, the clock CLK is not input, namely, CLK is maintained at low. Accordingly, as illustrated in FIG. 6A, during the write operation, P11, N11, N12 and N13 are turned off.

When the write signal MS is changed to high, TG11 and TG12 become a through-state. In FIG. 6A, an output of Inv12 is low since node US1 is high, and an output of Inv13 is high since node US2 is low. Accordingly, a current path from an output of Inv13, of which level is high, to an output of Inv12, of which level is low, via TG12, MTJ2, MTJ1 and TG11 is formed, and a current flows along this current path. Therefore, the current flows in the reverse direction through MTJ1, and the current flows in the forward direction through MTJ2. By this, the write operation in which MTJ1 is set to have a resistance of large and MTJ2 is set to have a resistance of small is carried out.

When Q OUTPUT is high, node US1 is low and node US2 is high, a write current flows a path from the output of Inv12, of which level is high, to the output of Inv13, of which level is low, via TG11, MTJ1, MTJ2 and TG12. By this, the write operation in which MTJ1 is set to have a resistance of small and MTJ2 is set to have a resistance of large is carried out.

As described above, the write operation in which states of MTJ1 and MTJ2 are set to states corresponding to the data held at the latch circuit of the second stage (namely, the data holding circuit) is carried out, and the data held by the latch circuit is stored in MTJ1 and MTJ2. When the write operation is completed, the write signal MS is returned to low. In practice, a time duration to fully change the states of MTJ1 and MTJ2 is previously determined, and MS is set high during that time duration.

In the read operation, the write signal MS is maintained at low, and the read signal MR is set to high. At this condition, the clock CLK is not input, namely, CLK is maintained at low. Accordingly, as illustrated in FIG. 6B, during the write operation, TG11 and TG12 are turned off.

When the read signal MR is changed to high, P11 turns on, and N11, N12 and N13 in FIG. 3 turn on. By this, US1 and US2 become low. Then, MR returns to low, P11, N11, N12 and N13 turn off, and one of US1 and US2 becomes high. At this time, currents flow through a path from US1 to N13 via N11 and MTJ1 and a path from US2 to N13 via N12 and MTJ2. A difference between the currents flowing through the two paths is generated since the resistance of MTJ1 and the resistance of MTJ2 is different as described above. By the difference, the latch circuit is recovered to a state of when the write operation is carried out.

In FIG. 6B, since the resistance of MTJ1 is large and the resistance of MTJ2 is small, a current flowing through MTJ1 is smaller than a current flowing through MTJ2. Therefore, US1 becomes high, US2 becomes low, and Q OUTPUT becomes low.

When the resistance of MTJ1 is small and the resistance of MTJ2 is large, the current flowing through MTJ1 is larger than the current flowing through MTJ2. Therefore, US1 becomes low, US2 becomes high, and Q OUTPUT becomes high.

As described above, the read operation in which the latch circuit of the second stage (namely, the data holding circuit) is set to a state corresponding to the states of MTJ1 and MTJ2 is carried out. In other words, the data held in the data holding circuit of before the power supply is stopped is recovered. When the read operation is completed, the read signal MR is returned to low.

Figure 7:
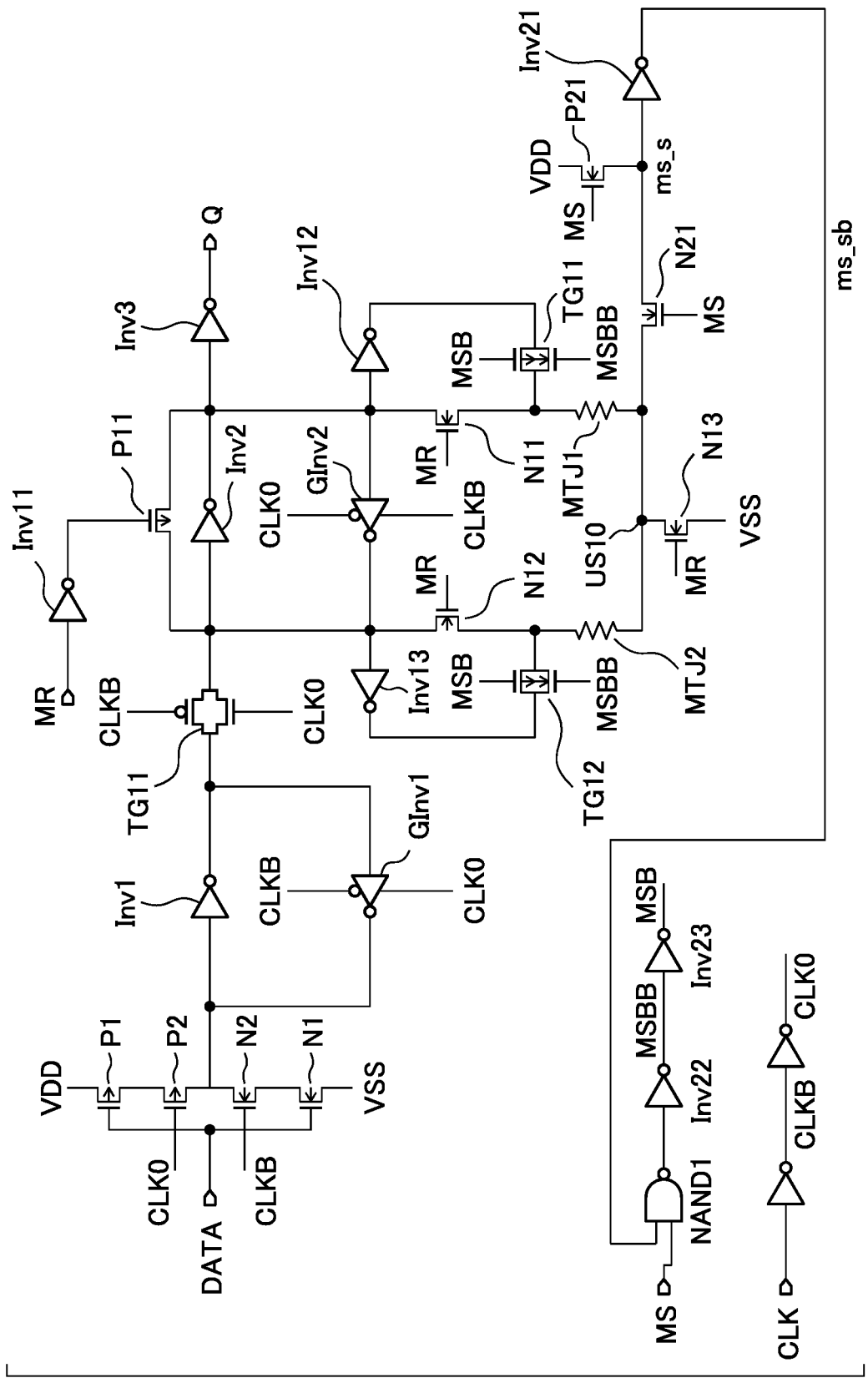
FIG. 7 is a circuit diagram of a data holding circuit of a second embodiment.

FIG. 7 is a circuit diagram of a data holding circuit of a second embodiment.

The data holding circuit of the second embodiment differs from the data holding circuit of the first embodiment in that a circuit for reducing current consumption in the write operation is newly provided. Other portions of the data holding circuit of the second embodiment are same as those of the first embodiment. In the following, only different portions will be described.

The data holding circuit of the second embodiment is a circuit in which a write control circuit is provided in the data holding circuit of the first embodiment. The write control circuit stops the write signal when a potential at the connection node US10 of the two MTJ elements MTJ1 and MTJ2 becomes high in the write operation.

The write control circuit includes: an N-channel transistor N21; a P-channel transistor P21; inverters Inv21-Inv23; and a gate NAND1. One of terminals of N21 is connected to the node US10, the other of terminals of N21 is connected to an input of Inv21, and the write signal MS is applied to a gate of N21. P21 is connected between the high-side power supply line VDD and a connection node of N21 and Inv21, and the write signal MS is applied to a gate of N21. An input of N21 is connected to a connection node of N21 and P21, and an output of Inv21 is input to NAND1. NAND1 receives the write signal MS and the output of Inv21. Inv22 inverts an output of NAND1 to output a write control signal MSBB. Inv23 inverts the write control signal MSBB to output an inverted write control signal MSB. MSB and MSBB are applied to gates of TG11 and TG12.

In the first embodiment, the write signal MS and the inverted write signal MSB are applied to the gates of TG11 and TG12, TG11 and TG12 become the through-state during MS is high, and the write current flows. As described above, the time duration in which MS is high is determined so that the states of MTJ1 and MTJ2 are certainly changed with reference to tolerances of processes, a temperature, a supply voltage, etc. When the time duration is determined is the above-mentioned way, the write current continues to flow after the latch circuit is set to the state corresponding to the stored data. This wastes the current. In particular, when the states of MTJ1 and MTJ2 have already become states corresponding to data held by the data holding circuit, the write current are almost wasted.

In the second embodiment, it is noted that a potential at the connection node US10 of MTJ1 and MTJ2 certainly becomes higher than a predetermined level when MTJ1 and MTJ2 become states corresponding to data held by the data holding circuit.

Figure 8A:
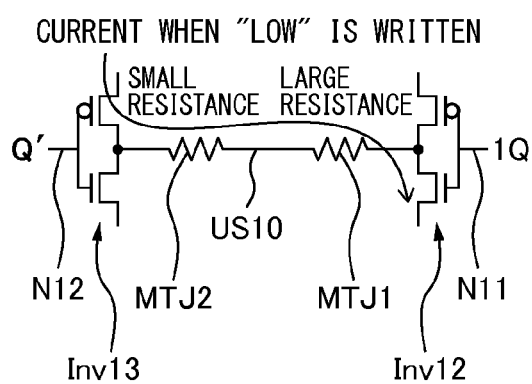
FIGS. 8A and 8B are diagrams explaining a potential level at a connection node of MTJ1 and MTJ2 in a write operation.
Figure 8B:
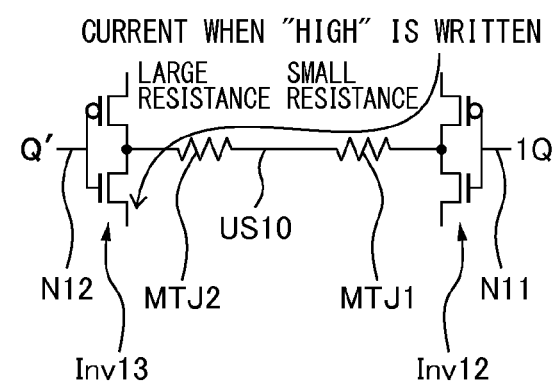

FIGS. 8A and 8B are diagrams explaining the potential level at the connection node US10 of MTJ1 and MTJ2 in the write operation.

FIG. 8A illustrates a current flowing through MTJ1 and MTJ2 when Q OUTPUT is low, node N11 is high, and node N12 is low, namely, "Low" is written. A potential of the node N11 is represented as /Q since it is an inverted level of the Q OUTPUT, and a potential of the node N12 is represented as Q' since it is same as the level of the Q OUTPUT. Since /Q, namely a signal of high level is applied to a gate of Inv12, N-channel transistor (NchTr) of Inv12 turns on. Since Q', namely a signal of low level is applied to a gate of Inv13, P-channel transistor (PchTr) of Inv13 turns on. Since TG11 and TG12 are at through-state, a current path from PchTr of Inv13 to NchTr of Inv12 via TG12, MTJ2, MTJ1 and TG11 is formed. Since the write current flows through this path, the resistance of MTJ1 is set to be large, and the resistance of MTJ2 is set to be small. In other words, when the resistance of MTJ1 is set to be large and the resistance of MTJ2 is set to be small, the write operation is completed.

For example, it is assumed that the resistance of MTJ1 is small and the resistance of MTJ2 is large when the write operation is started. At an initial period in which the write current flows as illustrated in FIG. 8A, the potential of the node US10 is determined by a ratio of resistances of MTJ1 and MTJ1 and it is lower than an intermediate level of VDD and VSS. Then, the resistance of MTJ1 changes to be large and the resistance of MTJ2 changes to be small by the write current. By this, the potential of the node US10 becomes higher than the intermediate level of VDD and VSS. Further, it is assumed that the resistance of MTJ1 is large and the resistance of MTJ2 is small when the write operation is started. At the initial period, the potential of the node US10 is higher than the intermediate level of VDD and VSS. This state does not change although the write operation is carried out. In other words, a state in which the potential of the node US10 is higher than the intermediate level of VDD and VSS is a state in which the write operation is completed in spite of the previous state.

FIG. 8B illustrates a current flowing through MTJ1 and MTJ2 when Q OUTPUT is high, node N11 is low, and node N12 is high, namely, "High" is written. A current path from PchTr of Inv12 to NchTr of Inv13 via TG11, MTJ1, MTJ2 and TG12 is formed. Since the write current flows through MTJ1 in the forward direction, the resistance of MTJ1 is set to be small. Since the write current flows through MTJ2 in the reverse direction, the resistance of MTJ2 is set to be large. In this case, a state in which the potential of the node US10 is higher than the intermediate level of VDD and VSS is also a state in which the write operation is completed in spite of the previous state.

Accordingly, in both cases in which the "low" state and the "high" state are written, when the potential of the node US10 is higher than the intermediate level of VDD and VSS, the write operation is completed.

In the second embodiment, when the write operation is carried out, P21 turns off, N21 becomes in the through state, and an intermediate level of VDD and the potential of US10 is generated at ms_s. A potential of ms_s changes according to the potential of US10. A threshold level of Inv21 is set to the potential of ms_s when the potential of US10 is the predetermined level. By this, when the potential of US10 becomes higher than the predetermined level, an output of Inv21 changes to low, MSBB changes to low, and MSB changes to high. This change is equivalent to that the write signal becomes low. TG11 and TG12 to which MSB and MSBB are applied turn off, and the write operation is finished. Thus, in the second embodiment, when the potential of the node US10 designates that MTJ1 and MTJ2 becomes states corresponding to the data held in the latch circuit, the write signal is finished, and the write operation is finished.

FIG. 9 is a time chart illustrating changes of a write signal MS, a potential of a node US10, and a write control signal MSBB. The left side of the time chart illustrates a case in which conditions of MTJ1 and MTJ2 (namely, values maintained by MTJ1 and MTJ2) are different from values maintained in the data holding circuit (the latch circuit). In other words, the left side of the time chart illustrates a case in which the conditions of MTJ1 and MTJ2 are changed by the write operation. The right side of the time chart illustrates a case in which the conditions of MTJ1 and MTJ2 are not changed by the write operation.

The write signal MS is a signal which becomes high for a predetermined period. When the conditions of MTJ1 and MTJ2 are changed, a write current flows during the period in which the write signal MS is high. By this, as illustrated in the left side, the potential of US10 once changes from an intermediate level to a low level, and then changes to the high level and is stable at the high level. When the potential of US10 becomes to the high level, the changes of the conditions of MTJ1 and MTJ2 by the write operation are finished. However, the write current continues to flow during the write signal MS is high. The current flowing after the potential of US10 becomes high is wasteful.

When the conditions of MTJ1 and MTJ2 are not changed, as illustrated in the right side, the potential of US10 promptly increases from the intermediate level to a high level, and is stable at the high level. In this case, a flowing current during the write signal MS is high is almost wasteful.

In the second embodiment, as illustrated in FIG. 9, the write control signal MSBB returns to low when the potential of US10 becomes higher than a predetermined level. Therefore, the write operation is completed and the waste current does not flow. Accordingly, since the write current does not flow during the periods designated by arrows in FIG. 9, the power consumed in the write operation are reduced.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a illustrating of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A data holding circuit comprising:
   a latch circuit having a first terminal and a second terminal, a logical value held at the first terminal being changed according to a value to be held by the data holding circuit, and the second terminal holding an inverted logical value of the logical value held at the first terminal; and
   a storing circuit which stores the logical values held at the first terminal and the second terminal in response to a write signal, and sets the logical values held at the first terminal and the second terminal to the stored logical values in response to a read signal, wherein
   the storing circuit includes two Magnetic Tunnel Junction elements which are connected in series between the first terminal and the second terminal and in reverse directions to each other, and
   the storing circuit includes a write circuit which flows a write current from one of the first terminal and the second terminal to the other of the first terminal and the second terminal via the two Magnetic Tunnel Junction elements in response to the write signal, a potential of the one of the first terminal and the second terminal being higher than a potential of the other of the first terminal and the second terminal, and sets the two Magnetic Tunnel Junction elements in conditions corresponding to a direction of the write current.

2. The data holding circuit according to claim 1, wherein the storing circuit includes
   a read circuit which flows currents through a first path from the first terminal to one of the two Magnetic Tunnel Junction elements and through a second path from the second terminal to the other of the two Magnetic Tunnel Junction elements in response to the read signal, and sets logical values of the first terminal and the second terminal to be values corresponding to a difference of the conditions of the two Magnetic Tunnel Junction elements.

3. The data holding circuit according to claim 2, wherein the write circuit includes a write control circuit which stops the write signal when a potential of a connection node of the two Magnetic Tunnel Junction elements becomes a first level.

4. The data holding circuit according to claim 1, wherein the latch circuit is one of two latch circuits forming a flip-flop circuit and forming a later stage of the flip-flop circuit.

5. A semiconductor device including a data holding circuit, the data holding circuit comprising:
    a latch circuit having a first terminal and a second terminal, a logical value held at the first terminal being changed according to a value to be held by the data holding circuit, and the second terminal holding an inverted logical value of the logical value held at the first terminal; and
    a storing circuit which stores the logical values held at the first terminal and the second terminal in response to a write signal, and sets the logical values held at the first terminal and the second terminal to the stored logical values in response to a read signal, wherein
    the storing circuit includes two Magnetic Tunnel Junction elements which are connected in series between the first terminal and the second terminal and in reverse directions to each other, and
    the storing circuit includes a write circuit which flows a write current from one of the first terminal and the second terminal to the other of the first terminal and the second terminal via the two Magnetic Tunnel Junction elements in response to the write signal, a potential of the one of the first terminal and the second terminal being higher than a potential of the other of the first terminal and the second terminal, and sets the two Magnetic Tunnel Junction elements in conditions corresponding to a direction of the write current.

6. A holding data recovery method storing a value held by a latch circuit having a first terminal and a second terminal, the second terminal holding an inverted logical value of the logical value held at the first terminal, before a power supply is stopped, and setting the stored value in the latch circuit when the power is supplied again, comprising:
    before a power supply being stopped, flowing a write current from one of the first terminal and the second terminal to the other of the first terminal and the second terminal via two Magnetic Tunnel Junction elements, which are connected in series between the first terminal and the second terminal and in reverse directions to each other, in response to a write signal, a potential of the one of the first terminal and the second terminal being higher than a potential of the other of the first terminal and the second terminal, and setting the two Magnetic Tunnel Junction elements in conditions corresponding to a direction of the write current; and
    when the power being supplied again, flowing currents through a first path from the first terminal to one of the two Magnetic Tunnel Junction elements and through a second path from the second terminal to the other of the two Magnetic Tunnel Junction elements in response to the read signal, and setting logical values of the first terminal and the second terminal to be values corresponding to a difference of the conditions of the two Magnetic Tunnel Junction elements.

7. The holding data recovery method according to claim 6, wherein when setting the two Magnetic Tunnel Junction elements in conditions corresponding to the direction of the write current, stopping the write signal when a potential of a connection node of the two Magnetic Tunnel Junction elements becomes a first level.

* * * * *